(12) United States Patent
Bauer et al.

(10) Patent No.: US 7,749,864 B2
(45) Date of Patent: Jul. 6, 2010

(54) SEMICONDUCTOR DEVICE WITH A THINNED SEMICONDUCTOR CHIP AND METHOD FOR PRODUCING THE THINNED SEMICONDUCTOR CHIP

(75) Inventors: Michael Bauer, Nittendorf (DE); Ludwig Heitzer, Regensburg (DE); Jens Pohl, Bernhardswald (DE); Peter Strobel, Regensburg (DE); Christian Stuempfl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 128 days.

(21) Appl. No.: 11/866,853

(22) Filed: Oct. 3, 2007

(65) Prior Publication Data

US 2008/0242057 A1   Oct. 2, 2008

Related U.S. Application Data

(62) Division of application No. 11/465,547, filed on Aug. 18, 2006, now Pat. No. 7,294,916.

(51) Int. Cl.
*H01L 21/30* (2006.01)
(52) U.S. Cl. .............................. 438/459; 257/E21.223; 257/E21.232; 257/618
(58) Field of Classification Search ................. 438/748, 438/459, 464, 465; 257/618, 678, E21.223, 257/E21.232
See application file for complete search history.

(56) References Cited

U.S. PATENT DOCUMENTS

| | | | | |
|---|---|---|---|---|
| 5,106,450 A | * | 4/1992 | Freisitzer et al. ............ | 156/517 |
| 5,695,658 A | * | 12/1997 | Alwan ........................ | 216/42 |
| 5,851,928 A | * | 12/1998 | Cripe et al. ................. | 438/748 |
| 6,140,707 A | * | 10/2000 | Plepys et al. ................ | 257/778 |
| 6,426,518 B1 | * | 7/2002 | Shakuda et al. ............... | 257/79 |
| 6,759,311 B2 | * | 7/2004 | Eldridge et al. ............. | 438/460 |
| 7,405,108 B2 | * | 7/2008 | Burrell et al. ............... | 438/125 |
| 2002/0158345 A1 | * | 10/2002 | Hedler et al. ............... | 257/786 |
| 2005/0095813 A1 | * | 5/2005 | Zhu et al. ................... | 438/459 |
| 2006/0110851 A1 | * | 5/2006 | Burrell et al. ............... | 438/108 |

FOREIGN PATENT DOCUMENTS

| | | |
|---|---|---|
| DE | 10048881 A1 | 3/2002 |
| DE | 10054038 A1 | 5/2002 |
| DE | 10120408 A1 | 10/2002 |
| DE | 102004009742 A1 | 9/2005 |
| EP | 1542239 A1 * | 6/2005 |

* cited by examiner

*Primary Examiner*—Davienne Monbleau
*Assistant Examiner*—Shweta Mulcare
(74) *Attorney, Agent, or Firm*—Dicke, Billig & Czaja, PLLC

(57) ABSTRACT

A semiconductor device with a thinned semiconductor chip and a method for producing the latter is disclosed. In one embodiment, the thinned semiconductor chip has a top side with contact areas and a rear side with a rear side electrode. In this case, the rear side electrode is cohesively connected to a chip pad of a circuit carrier via an electrically conductive layer. In another embodiment, the thinned semiconductor chips of this semiconductor device according to the invention have low-microdefect edge side regions with semiconductor element structures and edge sides patterned by etching technology.

22 Claims, 3 Drawing Sheets

SEMICONDUCTOR DEVICE WITH A THINNED SEMICONDUCTOR CHIP AND METHOD FOR PRODUCING THE THINNED SEMICONDUCTOR CHIP

CROSS-REFERENCE TO RELATED APPLICATIONS

This Utility Patent Application claims priority to German Patent Application No. DE 10 2005 039 479.5, filed on Aug. 18, 2005, and is a Divisional Application of U.S. patent application Ser. No. 11/465,547, filed on Aug. 18, 2006 now U.S. Pat. No. 7,294,916, both of which are incorporated herein by reference.

BACKGROUND

The invention relates to a semiconductor device with a thinned semiconductor chip and a method for producing the thinned semiconductor chip. In one embodiment, the thinned semiconductor chip has a patterned top side with contact pads and a rear side with a rear side electrode. The rear side electrode is cohesively connected to a chip pad of a circuit carrier via an electrically conductive layer.

Thinned semiconductor chips of this type are used in power electronics, in particular. After completion, for example, of a "CoolMOS" structure, the MOSFET function is arranged in the upper region of a semiconductor body, while the relatively thick substrate only represents a resistance between drain electrode on the rear side and source electrode on the top side, which disadvantageously increases the on resistance of the field effect power semiconductor device and generates heat loss.

Therefore, there is a need to come down from the original thickness of a semiconductor wafer to a thickness of the semiconductor body in which only active structures are contained. Ballast material of a semiconductor substrate is thus removed from the rear side by thinning. However, as the trend for thinning semiconductor wafers increases, the handling problems of such thinned semiconductor wafers increase. Thinned semiconductor wafers having a diameter of 30 cm and a thickness after thinning of less than 100 μm are practically no longer handleable per se as semiconductor wafers. If semiconductor wafers are additionally sawn up, as is customary, then microcracks and microdefects propagate from the sawing track in the edge regions of the semiconductor chips, and can impair the function of the semiconductor devices situated thereon and greatly reduce the usable area of a thinned semiconductor chip, or render unusable the entire semiconductor device which has a thinned semiconductor chip of this type.

Consequently, there is a need to reduce the original thickness of a semiconductor wafer of between 750 μm and 1200 μm to a thinned semiconductor wafer slice having a thickness of less than 100 μm. Furthermore, there is a need to keep the edge side defects as small as possible when separating the thinned semiconductor wafer.

Document DE 100 54 038 A1 discloses a method for separating semiconductor wafers whilst reducing the thickness of the individual pieces. Individual pieces are understood here to mean the semiconductor chips which are intended to be thinned to a predetermined thickness. For this purpose, the same document discloses an apparatus for producing such thinned semiconductor chips from plate-type bodies. The document discloses in principle completely producing the semiconductor chips on the top side of the semiconductor wafer before the semiconductor wafers are separated into individual pieces. Moreover, the document discloses that the separation operation is carried out before the thinning by grinding, and for this purpose depressions are introduced from the top side of the semiconductor wafer by sawing technology, which depressions are intended subsequently to form the edge regions of the singulated and thinned semiconductor chips.

If a surface of a semiconductor wafer has been prepared with sawing grooves in that way, it is adhesively bonded onto a carrier, so that the rear side of the semiconductor wafer is freely accessible and, with the aid of the carrier, the semiconductor wafer can then be ground thin from the rear side until the sawing grooves or depressions on the active top side of the semiconductor wafer are reached and the semiconductor wafer is thus now present in a fashion separated into individual semiconductor chips fixed on the carrier, without the thinned semiconductor wafer having to be handled.

This method and this apparatus have the disadvantage that the depressions introduced represent sawing grooves, the sawing operation from the top side of the semiconductor wafer, taking account of the defect situation in the edge regions, of the semiconductor chips being an extremely coarse process. During such a sawing process using diamond saws, a multiplicity of dislocations and other crystal defects are injected in the monocrystalline semiconductor wafer material, so that the edge side regions are unsuitable for active devices, so that the edge side regions can only accommodate contact pads which do not rely on a perfect monocrystalline crystal microstructure.

For these and other reasons, there is a need for the present invention.

SUMMARY

The invention provides a semiconductor device with a thinned semiconductor chip and a method for producing the latter. In one embodiment, the thinned semiconductor chip has a top side with contact areas and a rear side with a rear side electrode. In this case, the rear side electrode is cohesively connected to a chip pad of a circuit carrier via an electrically conductive layer. In another embodiment, the thinned semiconductor chips of this semiconductor device according to the invention have low-microdefect edge side regions with semiconductor element structures and edge sides patterned by etching technology.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a schematic cross section through a semiconductor wafer before the thinning process.

FIG. 3 illustrates a schematic cross section through the semiconductor wafer from FIG. 2 after the thinning process.

FIG. 4 illustrates a schematic cross section through the thinned semiconductor wafer in accordance with FIG. 3 after the patterning of the thinned rear side of the semiconductor wafer.

FIG. 5 illustrates a schematic cross section through the thinned semiconductor wafer in accordance with FIG. 4 during the etching process.

FIG. 6 illustrates a schematic cross section through the semiconductor wafer in accordance with FIG. 5 after the etching process.

DETAILED DESCRIPTION

Figure 1:
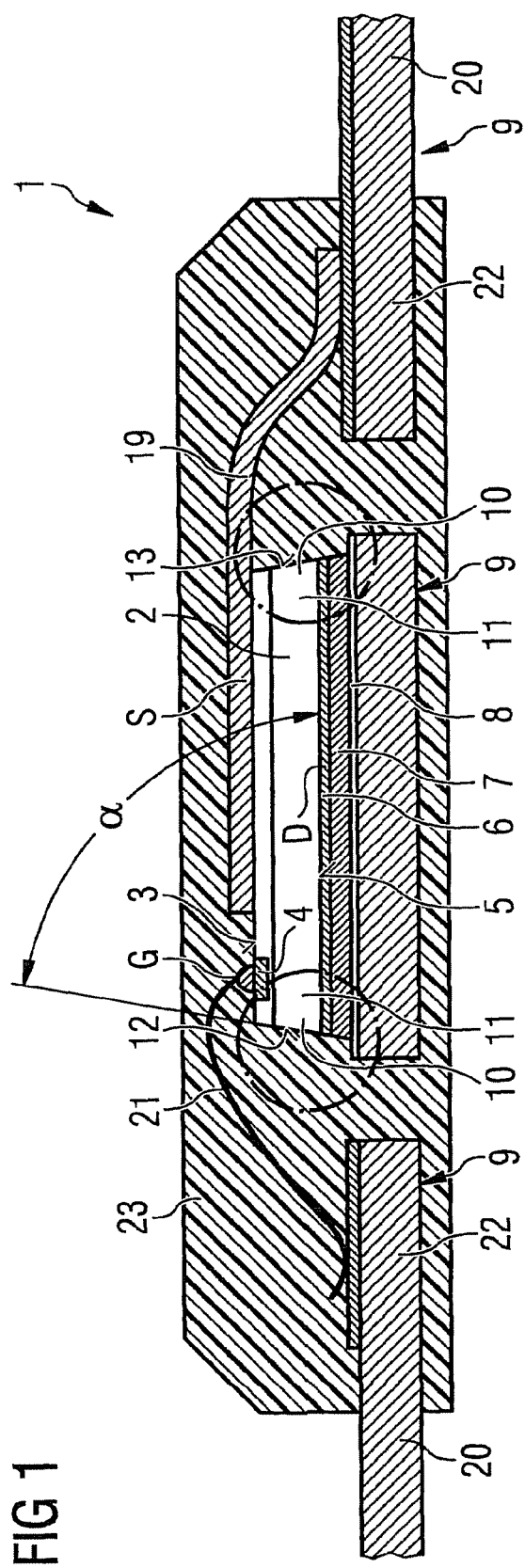
FIG. 1 illustrates a schematic cross section through a semiconductor power device with a thinned semiconductor chip, in accordance with a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor device having thinned semiconductor chips, the thinned semiconductor chip having a patterned top side with contact pads and a rear side with a rear side electrode. Furthermore, the semiconductor device is intended to have a semiconductor chip which does not have the disadvantages presented above and can be produced cost-effectively.

In one embodiment, the invention provides a semiconductor device having a thinned semiconductor chip, the thinned semiconductor chip having a patterned top side with contact pads and a rear side. In this case, the rear side is cohesively connected to a chip pad of a circuit carrier via a layer, the layer being an adhesion layer made of etching-resistant material. The edge side regions of the semiconductor chip are patterned by etching technology. On account of the mild processing by etching technology, the thinned semiconductor chip has low-microdefect edge regions with semiconductor element structures.

Compared with laser separation methods or sawing separation methods, the etching-technological patterning and separation methods have the advantage that the microstructure of the monocrystalline semiconductor is destroyed practically only in the separation tracks, but no defects propagate from the separation track into the adjoining semiconductor material of the thinned semiconductor chips. Etching separation techniques for semiconductor wafers are not used simply because etching pits that take up a large part of the area of the semiconductor wafer arise when the thickness of the semiconductor wafers is between 750 µm and 1250 µm. A completely different situation arises, however, if a thinned semiconductor wafer can be taken as a basis.

Since the etching track width corresponds approximately to the thickness of the semiconductor wafer, etching tracks which are very small in relation to previous separation technologies are achieved in the case of thinned semiconductor wafers. Moreover there is the advantage that the semiconductor material in the vicinity of the separation tracks is directly suitable for the introduction of semiconductor structures since separation by etching technology injects no additional microdefects whatsoever into the monocrystalline semiconductor region. Consequently, not only is it possible for a semiconductor device with such a thinned semiconductor chip separated by etching technology from a semiconductor wafer to have improved values of the activation resistance, but it is also possible for the area of the semiconductor chip to be fully used for semiconductor structures.

This means a gain in area of up to 30 percent for the semiconductor chips and for the semiconductor device which is equipped with such a thinned semiconductor chip separated by etching technology. The smaller the areal extent of the semiconductor chip, the greater the percentage gain in area. With large-area semiconductor chips, the gain in area decreases correspondingly and may fall to a few percent.

In a further embodiment of the invention, the edge sides patterned by etching technology have an angle with respect to the rear side of the thinned semiconductor chip of approximately 53 degrees. The angle is dependent on the orientation of the monocrystalline semiconductor crystal, which is preferably produced from silicon, in the case of which such an angular relation is established which is advantageous for the edge sides if only because the areal extent of the rear sides of the semiconductor chips is thus slightly larger than the areal extent of the active top sides of the semiconductor chips.

In a further embodiment of the invention, the layer on the rear side of the thinned semiconductor chip includes an electrically conductive adhesion layer made of etching-resistant material. Such an etching-resistant, electrically conductive adhesion layer may preferably include a double-sided adhesive film, the film being filled with metal particles in order to ensure an electrical conductivity. The etching resistance in turn is ensured by the plastic of the film, so that throughout the processing there is no need to separate the semiconductor chip from the etching film, rather it is possible to use the etching film simultaneously for fixing the semiconductor chip in the semiconductor device.

For the semiconductor device this affords the advantage that the etching-resistant film can simultaneously be used as an adhesive film on the circuit carrier of the semiconductor device, so that a semiconductor device having a thinned semiconductor chip can be provided cost-effectively. On the other hand, it is also possible for the electrically conductive layer on the rear side of the thinned semiconductor chip to have a solder layer made of etching-resistant material. Solder layers of this type preferably have a gold-aluminum alloy which can withstand the etching gases during plasma etching or the etching liquids during wet etching.

A method for producing thinned semiconductor chips, for improved semiconductor devices of this type, has the following process. In one embodiment, a semiconductor wafer is produced, having a multiplicity of semiconductor chip positions which are arranged in rows and columns and have a top side with semiconductor element structures, interconnects and contact areas. In this case, semiconductor structures may also be provided in regions of the semiconductor chip positions that are near the edge. The semiconductor wafer is applied to an intermediate carrier by its top side without any separation preparation, the intermediate carrier also being required for the thinning by grinding. The semiconductor wafer is then thinned from its rear side, the entire rear side being removed to an extent such that essentially active semiconductor structures remain in the thinned region of the semiconductor wafer.

The rear side electrodes, in the semiconductor chip positions, may be applied to the thinned rear side of the semiconductor wafer. This may also involve ion implantation processes during which the rear side is provided with an increased concentration of defects before a rear side metallization for rear side electrodes takes place. An etching-resistant and adhesive layer is then applied to the rear side whilst leaving free etching tracks between the semiconductor chip positions. The etching-resistant layer, which may simultaneously serve as an adhesion layer for the rear side on corresponding circuit carriers in a semiconductor device, serves as a protective layer offering protection against the aggressive gases or liquids during the etching operation.

This is followed by separation etching of the semiconductor wafer along the etching tracks to form thinned semiconductor chips with low-microdefect edge side regions on the intermediate carrier. In this case, the etching operation is started from the rear side and ends at the interface with the intermediate carrier. The thinned semiconductor chips can then be processed further to form semiconductor devices having improved edge side properties of the semiconductor chips.

This method is distinguished by its mild treatment of the semiconductor crystal material, especially as no microdefects whatsoever are additionally injected into the semiconductor material during the etching along the etching tracks. Consequently, the monocrystalline structure of the edge regions is not disturbed, and semiconductor structures can be safely introduced in these edge regions.

The intermediate carrier, on which is carried out the etching operation and possibly also the preparation of the rear side with rear side contacts, ion implantation and application of an etching-resistant layer, may have a double-sided adhesive film. On the other hand, it is also possible to use a film as the intermediate carrier, as is customary in normal semiconductor technology, especially if the etching-technological separation of the semiconductor wafer into individual thinned semiconductor chips is effected by means of plasma etching technology, preferably by reactive ion etching.

The application of an etching-resistant and patterned layer to the rear side of the semiconductor wafer prior to the introduction of the etching grooves may be effected by a film being laminated on, in which case the etching tracks may subsequently be uncovered by laser ablation, for example. On the other hand, it is also possible for the electrically conductive, etching-resistant layer to be sprayed onto the rear side of the semiconductor wafer whilst leaving free etching tracks. Spraying techniques of this type are widespread in semiconductor technology and ensure that an exact structure with extremely fine etching trenches arises on the rear side of the semiconductor wafer.

Finally, in a one embodiment of the invention, it is possible to apply the electrically conductive and etching-resistant layer to the rear side of the semiconductor wafer whilst leaving free etching tracks by means of a printing-on process. This printing-on process may involve employing either a stencil printing method or a screen printing method known from printed circuit board technology. A further possibility also consists in applying the electrically conductive and etching-resistant layer to the rear side of the semiconductor wafer by employing a jet printing method, analogously to inkjet printing. In all of the method variants, an electrically conductive layer is applied which simultaneously has a sufficient adhesion strength in order to fix the rear side of the semiconductor chip on a corresponding semiconductor chip island of a circuit carrier.

Consequently, an overall method arises in which the handling of the thinned semiconductor chip is simplified in such a way that large reject rates are avoided and at the same time the usable surface of the semiconductor chips right into the edge regions can be significantly enlarged by comparison with conventional technologies such as the separation technique by means of sawing or by means of laser vaporization.

FIG. 1 illustrates a schematic cross section through a semiconductor power device 1 with a thinned semiconductor chip 2, in accordance with a first embodiment of the invention. In this respect, the thinned semiconductor chip 2 is arranged and electrically connected by its metallized rear side 5 on a chip pad 8 of a circuit carrier 9 via an electrically conductive layer 7 made of an etching-resistant and adhesive material. In this embodiment of the invention, the rear side 5 of the semiconductor chip 2 is the rear side 5 of a power semiconductor chip 2 and bears a drain electrode D as rear side electrode 6.

As a result of the thinning of the semiconductor chip 2, the majority of the semiconductor chip volume can be utilized for a charge-compensated drift path; such charge-carrier-compensated zones of the drift path can be introduced even in the edge regions 10 of the edge sides 12 and 13 since the thinned semiconductor chip 2 is distinguished by the fact that it has remained with few defects even in the regions in which it was separated from a semiconductor wafer. Consequently, large defect clusters or even microcracks do not occur in the case of this thinned semiconductor chip 2 of the present semiconductor device 1. Consequently, the entire semiconductor volume of the thinned semiconductor chip 2 can be utilized for semiconductor element structures 11, preferably of charge-carrier-compensated drift paths of a vertical field effect transistor.

Arranged on the top side 3 of the thinned semiconductor chip 2 is a large-area source electrode S, which covers almost the entire top side 3 of the thinned semiconductor chip 2 and which is connected via a bonding strip 19 and/or a plurality of bonding wires to an internal flat conductor 22 of the circuit carrier 9, which, for its part, merges into an external flat conductor 20, so that a source connection becomes possible from the external flat conductor 20. A smaller area region is taken up by the gate electrode G on the top side 3 of the thinned semiconductor chip 2. In this embodiment of the invention, the contact area 4 of the gate electrode G is connected via a bonding wire 21 to a corresponding internal flat conductor 22 which merges into an external flat conductor 20 and enables a gate connection.

The external flat conductor for the drain connection is not illustrated since this is only a cross section and, consequently, not all of the external connections of the semiconductor component 1 can be illustrated in this cross-sectional plane. The thinned semiconductor chip 2, and also the bonding connections 19 and 21, the chip pad 8 and the internal flat conductors 22 are encapsulated in a protective plastic housing composition 23. Besides the advantage that in the case of the thinned semiconductor chip 2 for this semiconductor device 1, semiconductor element structures 11 can also be realized in the edge region 10 since the edge sides 12 and 13 are introduced by etching technology, a further advantage arises, consisting in the fact that the semiconductor chip 2 is thinned from the rear side 5, so that the thick substrate portion that would increase the activation resistance of the semiconductor power device 1 has now been ground away and, consequently, an optimum activation resistance is achieved for this semiconductor power device 1. Finally, a third advantage arises for a semiconductor power device 1 of this type, namely that the device height was able to be minimized.

FIGS. 2 to 6 illustrate schematic cross sections through components after corresponding fabrication steps in the production of the thinned semiconductor chip 2. Moreover, FIGS. 2 to 6 demonstrate the particular advantages of the method according to the invention and of the semiconductor device according to the invention which can be produced from these thinned semiconductor chips 2.

Figure 2:
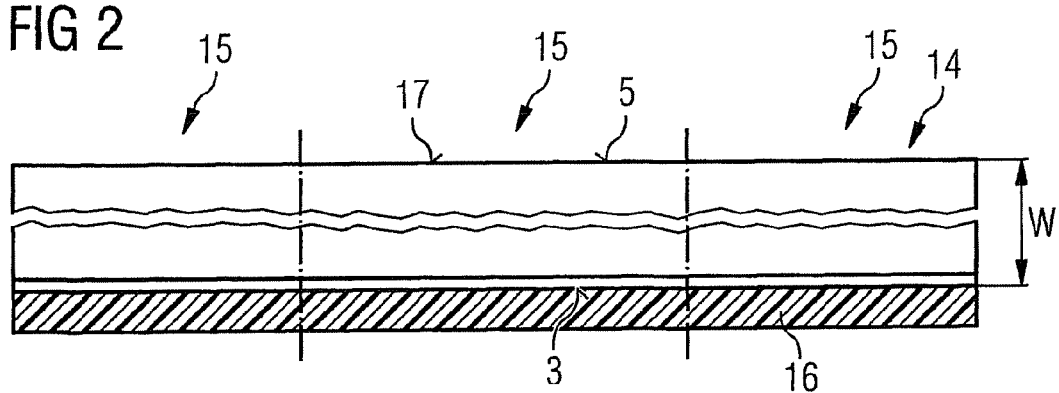
FIGS. 2 to 6 illustrate schematic cross sections through components after corresponding fabrication steps in the production of thinned semiconductor chips.

FIG. 2 illustrates a schematic cross section through a semiconductor wafer 14 before the thinning process. In this respect, the semiconductor wafer 14 with its device positions 15 which are arranged in rows and columns and extend on the top side 3 of the semiconductor wafer is fixed on an intermediate carrier 16. This figure already illustrates that the subsequent method proceeds distinctly differently than the previous methods which also take account of the problem of handling thin wafers.

In a known method in accordance with the document DE 100 54 038 A1, also called "dicing before grinding" or abbreviated to "DBG", rather than bringing the full wafer with its entire thickness W onto an intermediate carrier in the unground state, the wafer is conventionally firstly incipiently sawn from the active top side, subsequently laminated by the active side onto a grinding film and then ground thin from the rear side until the incipient sawn notches from the active side appear on the rear side in the course of thinning by grinding. With this technology, although the chips are simultaneously thinned and singulated, the sawing technique has the disadvantage that the edge regions of the thinned semiconductor chips have an increased defect density, so that in these regions only contact areas can be applied to the semiconductor chips and semiconductor element structures cannot be introduced.

The further disadvantage of this known method consists in the repeated relamination of the wafer, thus resulting in an increased risk of contamination. Compared with the DBG method, FIG. 2 illustrates that in the method according to the invention, the semiconductor wafer 14 patterned on its top side 3 is applied in its full thickness W to an intermediate carrier 16 without any sawing routes. The intermediate carrier 16 may be a mount such as is required for thinning the semiconductor wafer 14 by grinding from the rear side 17. After the semiconductor wafer 14 has been applied to the intermediate carrier 16, the semiconductor wafer 14 can be thinned from its rear side 5.

Figure 3:
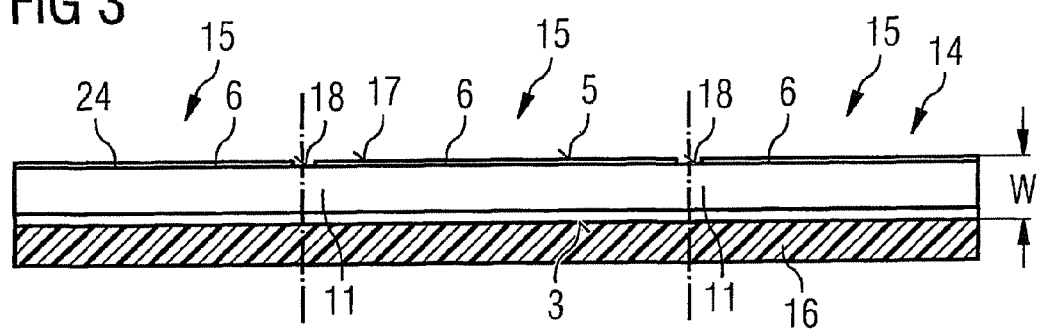

FIG. 3 illustrates a schematic cross section through the semiconductor wafer 14 in accordance with FIG. 2 after the thinning process. The original semiconductor wafer thickness W has now been reduced to a semiconductor wafer thickness w of less than 100 μm. The thinned rear side 5 can now be treated in order to prepare it for a wide variety of component requirements. By way of example, in the case of field effect power transistors, the rear side is also prepared as drain contact or drain electrode by a procedure in which an ion implantation takes place from the rear side and the rear side is subsequently metallized to form rear side electrodes 6 in order to provide a drain electrode. This patterned metallization 24 is illustrated on the thinned rear side 5 in FIG. 3.

Figure 4:
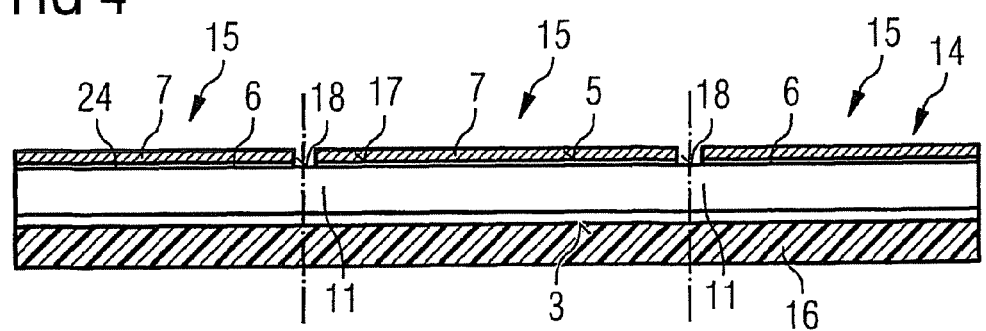

FIG. 4 illustrates a schematic cross section through the thinned semiconductor wafer 14 in accordance with FIG. 3 after the patterning of the thinned rear side 5 of the semiconductor wafer 14. During this patterning, a further layer 7 is additionally applied to the metallization 24 already present, which in principle defines the order of magnitude of the layers then to be applied, which further layer 7 is on the one hand etching-resistant and on the other hand has a high adhesiveness in order later to fix the thinned semiconductor chip on a circuit carrier. Layers of this type may preferably have metal-particle-filled polymers which on the one hand afford sufficient protection from the gaseous or liquid etching media and on the other hand, upon heating, form an adhesiveness that suffices to fix the rear side 5 of the thinned semiconductor chip on a chip pad, such as is illustrated in FIG. 1, of a circuit carrier. The layer 7 can be applied selectively and in patterned fashion by screen printing, stencil printing or jet printing as a "die attach material", or be applied in large-area fashion on the entire rear side 17 of the semiconductor wafer 14 by spraying technology, but the etching tracks 18 must then be uncovered at the boundaries of the semiconductor chip positions 15 in order to enable an etching attack.

Figure 5:
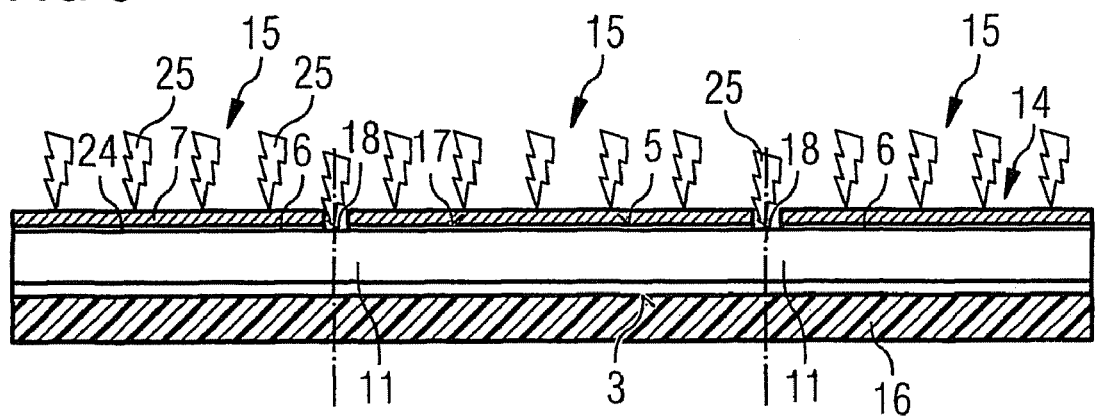

FIG. 5 illustrates a schematic cross section through the thinned semiconductor wafer 14 in accordance with FIG. 4 during the etching process. The etching attack of, for example, a dry etch in a plasma is symbolized by the arrows 25 indicated. In this case, the etching gas may be fully effective only in the etching tracks 18. Even if thin regions of the etching-resistant layer 7 are removed, the time for etching through the silicon does not suffice to completely remove the protective layer 7, so that after the etching tracks 18 have been etched through, there is also enough material both to ensure the patterned metallization 24 of the rear side 5 of the thinned semiconductor chips 2 and to ensure the adhesion of the semiconductor chip on a chip connection carrier of a circuit carrier of a corresponding semiconductor device.

Figure 6:
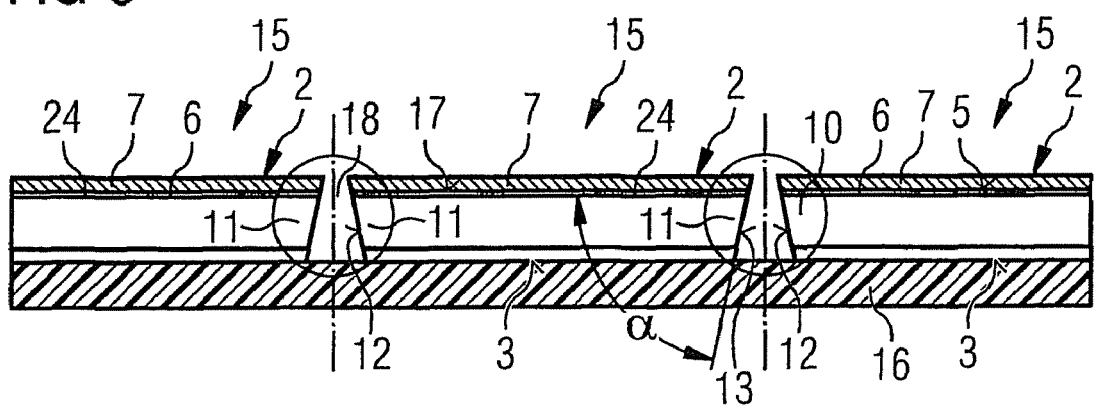

FIG. 6 illustrates a schematic cross section through the semiconductor wafer 14 in accordance with FIG. 5 after the etching process has reached the intermediate carrier 16. In this case, a preferred etching angle $\alpha$ is formed between the rear side 5 and the side edges 12 and 13 of the thinned semiconductor chips 2, which angle is predetermined by the orientation of the monocrystalline silicon and is preferably in the region of 53 degrees. With FIG. 6, the singulation of the thinned semiconductor wafer 14 into individual semiconductor chips 2 is practically concluded, so that it is then only necessary to transfer the semiconductor chips 2 onto the chip pads of a circuit carrier. This may particularly preferably be effected if the intermediate carrier is in two parts and has a thin carrier film which, by a second carrier, retains its dimensional stability during thinning by grinding and, after thinning by grinding, makes the semiconductor chips that have been ground thin available for further processing on the thin film after removal of the dimensionally stable carrier.

The method according to the invention, which is illustrated here by FIGS. 2 to 6 has the advantage that the die attach material is already applied in patterned fashion as an etching mask, or as an electrically conductive layer, to the rear side 5 of the thinned semiconductor chips 2. A laminating, printing or jet process may be carried out, inter alia, in this case. In this method, the areas for singulation, namely the etching routes are advantageously already present by virtue of these being kept free of the die attach material. If pasty materials are used as electrically conductive die attach material, it is advantageous to convert these materials into the precrosslinked B state. The method according to the invention as illustrated here by FIGS. 2 to 6 has the following:

1. a batch process is possible;
2. the operations for handling thinned wafers are minimized;
3. relamination is not necessary if suitable intermediate carriers 16 are used;
4. after singulation, the individual chips can be subjected directly to further processing;
5. there is a reduced risk of jagged fractures such as may occur as a result of the sawing operation;

6. very narrow separation routes can be realized by means of this method since the etching tracks between the electrically conductive layers 7 as etching mask are only a few micrometers and, moreover, these narrow etching tracks can be driven as far as the intermediate carrier by means of a directed dry etch in the plasma;

7. there is no need for any complicated, cost-intensive laminating process, and finally 8. a "DBG" grinding process or cost-intensive "DBG" additional equipment is not necessary.

Consequently, this method achieves a high reduction of costs and an improved quality for the thinned semiconductor chips by virtue of the use of an adhesive material for chips as etching mask for the singulation of thin wafers.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing thinned semiconductor chips, the method comprising:
    producing a semiconductor wafer with a multiplicity of semiconductor chip positions which are arranged in rows and columns and comprise a top side with semiconductor element structures, interconnects and contact areas;
    applying the semiconductor wafer to an intermediate carrier by its top side;
    thinning the semiconductor wafer from its rear side after applying the top side to the intermediate carrier;
    applying an etching-resistant layer to the rear side of the semiconductor wafer whilst leaving free etching tracks between the semiconductor chip positions; and
    separation etching of the semiconductor wafer along the etching tracks to form thinned semiconductor chips on the intermediate carrier; and
    performing an ion implantation and patterned metallization of the rear side after thinning the semiconductor wafer and before applying the etching-resistant layer, the patterned metallization leaving free the etching tracks between the semiconductor chip positions.

2. The method of claim 1, comprising:
    forming semiconductor devices by further processing of the thinned semiconductor chips.

3. The method of claim 2, comprising using a double-sided adhesive film as the intermediate carrier.

4. The method of claim 2, laminating the etch-resistant material onto the rear side of the semiconductor wafer whilst leaving free etching tracks.

5. The method of claim 2, spraying the etch-resistant material onto the rear side of the semiconductor wafer whilst leaving free etching tracks.

6. The method of claim 2, printing the etch-resistant material onto the rear side of the semiconductor wafer whilst leaving free etching tracks.

7. The method of claim 2, applying the etch-resistant material to the rear side of the semiconductor wafer by jet printing methods.

8. The method of claim 2, wherein prior to the application of the etch-resistant material, applying rear side electrodes, in the semiconductor chip positions, to the thinned rear side of the semiconductor wafer.

9. The method of claim 8, comprising using a double-sided adhesive film as the intermediate carrier.

10. The method of claim 8, laminating the etch-resistant material onto the rear side of the semiconductor wafer whilst leaving free etching tracks.

11. The method of claim 8, spraying the etch-resistant material onto the rear side of the semiconductor wafer whilst leaving free etching tracks.

12. The method of claim 8, printing the etch-resistant material onto the rear side of the semiconductor wafer whilst leaving free etching tracks.

13. The method of claim 8, applying the etch-resistant material to the rear side of the semiconductor wafer by jet printing methods.

14. A method for making an integrated circuit comprising:
    producing a semiconductor wafer with a multiplicity of semiconductor chip positions, including a top side and a rear side;
    applying the semiconductor wafer to an intermediate carrier by its top side;
    thinning the semiconductor wafer from its rear side after applying the top side to the intermediate carrier;
    applying an adhesive layer made of etch-resistant material to the rear side whilst leaving free etching tracks between the semiconductor chip positions; and
    separation etching of the semiconductor wafer along the etching tracks to form thinned semiconductor chips on the intermediate carrier; and
    performing an ion implantation and patterned metallization of the rear side after thinning the semiconductor wafer and before applying the etching-resistant layer, the patterned metallization leaving free the etching tracks between the semiconductor chip positions.

15. The method of claim 14, comprising:
    forming semiconductor devices by further processing of the thinned semiconductor chips.

16. The method of claim 15, comprising using a double-sided adhesive film as the intermediate carrier.

17. The method of claim 15, laminating the etch-resistant material onto the rear side of the semiconductor wafer whilst leaving free etching tracks.

18. The method of claim 15, spraying the etch-resistant material onto the rear side of the semiconductor wafer whilst leaving free etching tracks.

19. The method of claim 15, printing the etch-resistant material onto the rear side of the semiconductor wafer whilst leaving free etching tracks.

20. The method of claim 15, applying the etch-resistant material to the rear side of the semiconductor wafer by jet printing methods.

21. The method of claim 15, wherein prior to the application of the etching-resistant layer, applying rear side electrodes, in the semiconductor chip positions, to the thinned rear side of the semiconductor wafer.

22. The method of claim 21, comprising using a double-sided adhesive film as the intermediate carrier.

* * * * *